United States Patent [19]
Lambert

[11] Patent Number: 5,795,162
[45] Date of Patent: Aug. 18, 1998

[54] RF FLEX CIRCUIT TRANSMISSION LINE AND INTERCONNECTION METHOD

[75] Inventor: William R. Lambert, Morris, N.J.

[73] Assignee: Lucent Technologies, Inc., Murray Hill, N.J.

[21] Appl. No.: 623,087

[22] Filed: Mar. 28, 1996

[51] Int. Cl.$^6$ ................................................ H01R 9/09
[52] U.S. Cl. ................................................ 439/63; 439/67
[58] Field of Search ................................ 439/63, 67, 581

[56] References Cited

U.S. PATENT DOCUMENTS

| | | | |
|---|---|---|---|
| 4,534,602 | 8/1985 | Bley | 439/63 |
| 4,695,258 | 9/1987 | Hanson et al. | 439/329 |
| 4,820,376 | 4/1989 | Lambert et al. | 156/643 |
| 5,045,249 | 9/1991 | Jin et al. | 264/437 |
| 5,145,382 | 9/1992 | Dickerson | 439/63 |
| 5,148,135 | 9/1992 | Stein | 333/246 |
| 5,479,110 | 12/1995 | Game et al. | 439/67 |

OTHER PUBLICATIONS

Joseph DiGiacomo Digital Bus Handbook McGraw–Hill Publishing Company 1990, p. 1.4, 8.20–8.21, 10.6, 10.7, 10.32–10.39, 13.24–13.27.

*Primary Examiner*—Gary P. Paumen
*Assistant Examiner*—T. C. Patel

[57] ABSTRACT

An interconnection system comprises a circuit board having signal conductors for carrying electrical signals. The circuit board includes a plurality of contact pads coupled to each one of said signal conductors. An elastomeric compression interconnect is releasably disposed next to the contact pads of the circuit board. The elastomeric compression interconnect includes a composite material having magnetic, electrically conductive substantially spherical particles disposed in a nonconductive matrix material adapted to align into mutually isolated conductive chains. A radio frequency flex circuit is also releasably disposed next to the elastomeric compression interconnect. The flex circuit is made of a dielectric material and a bonding material exhibiting substantially low signal loss.

21 Claims, 4 Drawing Sheets

RF FLEX CIRCUIT TRANSMISSION LINE AND INTERCONNECTION METHOD

FIELD OF THE INVENTION

This invention relates generally to flexible transmission lines and more specifically to methods for interconnecting such lines to printed circuit boards.

BACKGROUND OF THE INVENTION

Many electronic applications require extensive radio frequency (RF) cabling. For example a typical RF section on the backplane of a wireless base station may consist of forty eight, approximately 24-inch long, coaxial cables. These coaxial cables form a point-to-point distribution fabric between the transmitter circuit packs and the switching circuit packs, and between the receiver circuit packs and the switching circuit packs—all employed in a wireless base station of a wireless communications system. A typical switching circuit pack has four RF connections: one to the transmitter; one to a first receiver; one to a second receiver; and one to a clock synchronization circuit. There may be at least twelve switching packs in each wireless base station. It will be appreciated that the number of coaxial cables employed to interconnect the RF components mentioned above may be substantially high. The cost of these coaxial cables contributes significantly to the overall cost of a typical RF distribution fabric.

Additional disadvantages associated with the use of coaxial cables are the space required to accommodate numerous cables, relatively low reliability and relatively high maintenance cost. Furthermore, as underlying electronic components of the circuit packs become smaller, the size of coaxial cables may become an impediment to miniaturization of the system. It should be noted that the above concerns with the use of coaxial cables in a RF distribution fabric of a wireless base station are also present in other applications that require the use of numerous cables.

Thus, there is a need for a system and a method that substantially eliminates disadvantages associated with the use of coaxial cables employed in RF distribution fabrics.

SUMMARY OF THE INVENTION

In accordance with one aspect of the invention an interconnection system for radio frequency RF applications may be employed. The interconnection system comprises a circuit board having signal conductors for carrying electrical signals. The circuit board includes at least one contact pad coupled to one of the conductors. A compression interconnect is employed to couple signal lines in the circuit board to signal lines in a radio frequency RF flex circuit. The interconnect, which may be made of an elastomeric material, includes a first and a second outer surface. The first outer surface is releasably disposed next to the contact pad of the circuit board. The radio frequency RF flex circuit has at least one contact pad coupled to an embedded signal conductor. The contact pad is releasably disposed next to the second outer surface of the compression interconnect to make electrical connection between the signal conductors in the circuit board and the flex circuit.

BRIEF DESCRIPTION OF THE DRAWINGS

The subject matter regarded as the invention is particularly pointed out and distinctly claimed in the concluding portion of the specification. The invention, however, both as to organization and method of operation, together with features, objects, and advantages thereof may best be understood by reference to the following detailed description when read with the accompanying drawings in which:

DETAILED DESCRIPTION OF THE INVENTION

Figure 1:
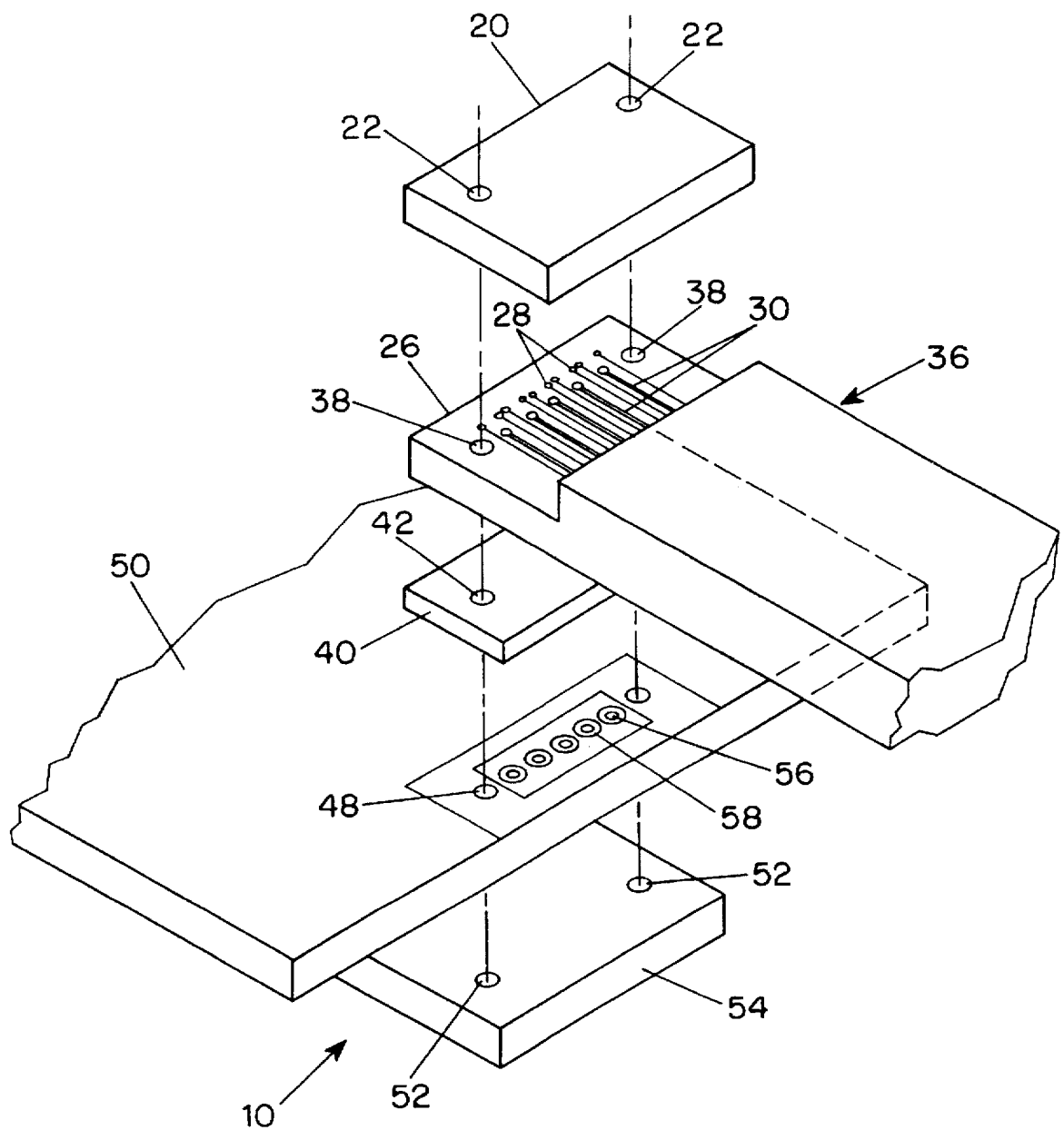
FIG. 1 is an exploded view of a portion of an interconnection system comprising a RF flex circuit, an elastomeric interconnect and a printed circuit board in accordance with the present invention.

FIG. 1 illustrates an exploded view of one embodiment of the invention such as an interconnection system 10 that may be employed in a radio frequency (RF) distribution fabric. The interconnection system comprises an RF flex circuit 36, a compression interconnect 40, and a radio frequency (RF) board 50.

Figure 3A:
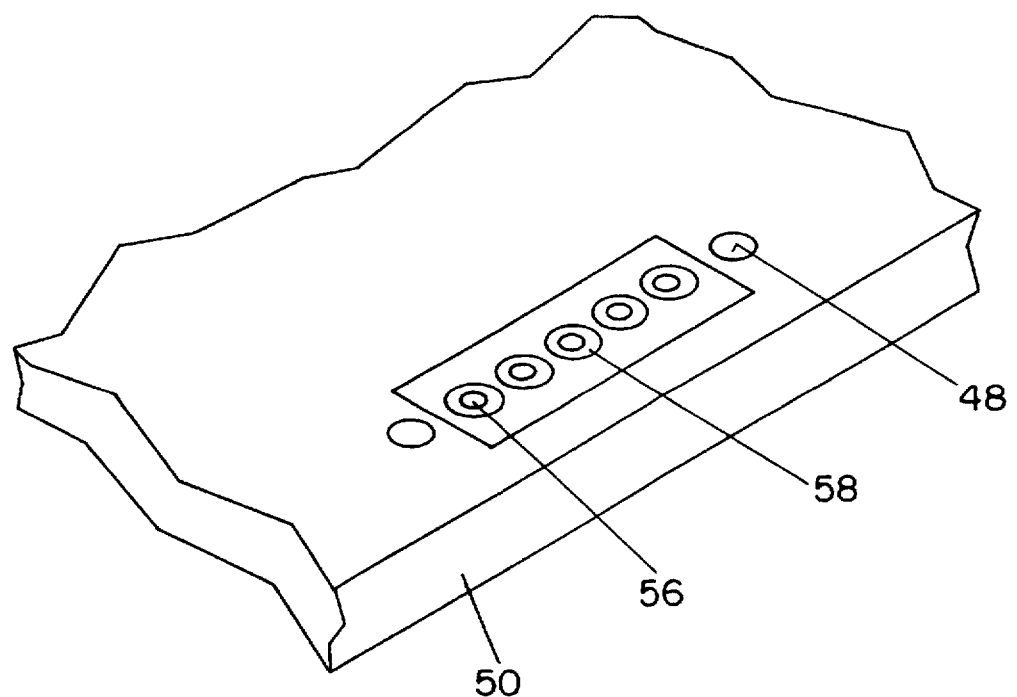
FIG. 3 illustrates an example of a circuit board employed in an interconnection system in accordance to the present invention.
Figure 3B:
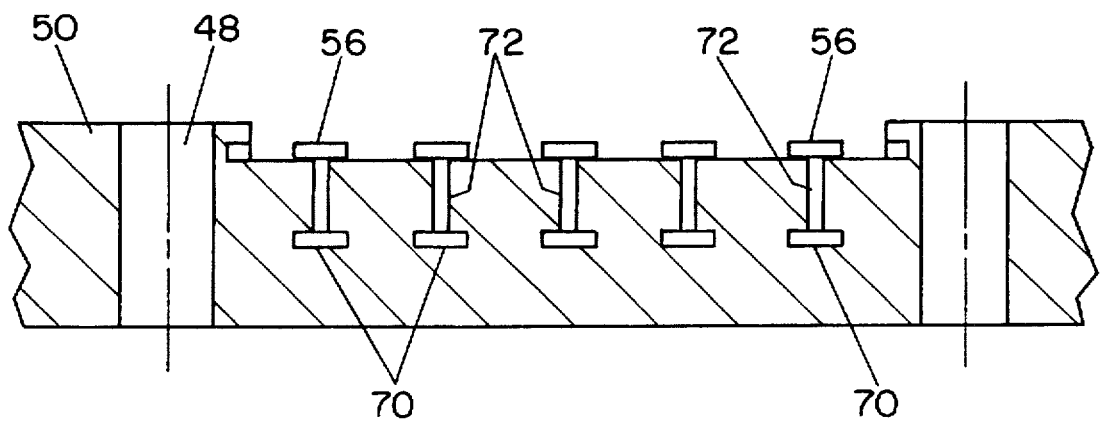

Typically, RF board 50 may be a printed circuit board having a plurality of radio frequency signal lines or traces, as described in more detail in reference with FIGS. 3a and 3b, although the invention is not limited in scope in that respect. For example, circuit packs in a wireless base station such as transmitter and receiver and switching circuit packs contain numerous signal lines that carry radio frequency signals. Such signal lines, are usually made of copper and may be embedded within the material that forms the printed circuit board. In the alternative the signal lines may be disposed on the outer layer of the printed circuit board. As will be explained in more detail hereinafter, in reference with FIG. 4, existing circuit packs may employ coaxial cable connectors for coupling signal lines to coaxial cables. Thus, it is desired to replace such connectors with a retrofit connector that couples signals in the signal lines to elastomeric interconnect 40 as will be explained in more detail below.

In accordance with one embodiment of the invention, circuit board 50 is preferably disposed over a substrate 54. This substrate may be made of a rigid material. For high frequency applications the substrate may be made of an insulating material such as plastic.

In an exemplary embodiment of the invention radio frequency signal lines of circuit board 50 may be coupled to compression interconnect 40 via contact pads 56. As will be explained, compression interconnect 40 may be made of an elastomeric material. Such contact pads may also be coupled to signal lines embedded within the circuit board via through-holes 72 (FIG. 2a) as will be explained in more detail hereinafter. Advantageously, annular ground areas 58 may surround contact pads 56 and through-holes 72.

Figure 2A:
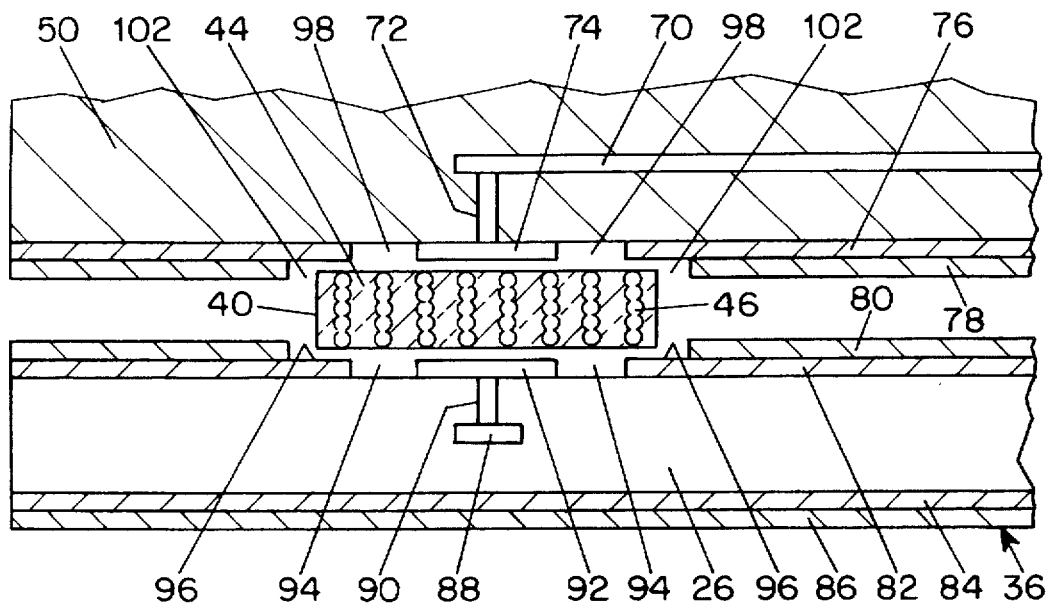
FIGS. 2a and 2b illustrate the side views of an interconnection system in accordance with the present invention.

Referring to FIGS. 1 and 2a, elastomeric compression interconnect 40 is advantageously positioned over circuit board 50, such that holes 42 of compression interconnect 40 overlay holes 48 of circuit board 50 and holes 52 of substrate 54. The design of elastomeric compression interconnects is well-known as described in the U.S. Pat. No. 5,045,249 issued to Jin et al. and in the U.S. Pat. No. 4,820,376 issued to Lambert et al., both of which are incorporated herein by reference. Basically electrical interconnections 46 are made by means of a layer or sheet medium comprising chains of magnetically aligned, electrically conducting particles in a non-conducting matrix material 44. Electrically conductive, magnetic particles are aligned into essentially straight chains as resulting from application of a magnetic field in the z-direction of desired conductivity transverse to the x-y plane of interconnect 40. End particles of chains may preferably protrude from a surface of the medium, thereby enhancing electrical contact properties of the medium. Electrical interconnections 46 may be attached to contact pads disposed at both sides of compression interconnect 40.

In accordance with one aspect of the present invention, the high frequency characteristics of elastomeric compression interconnects such as 40 is one of the factors that is preferably considered in its manufacture. For example, an interconnection such as 40 may be made by first mixing a silicone resin material such as RTV615 with 10 volume percent gold-coated nickel spheres having a diameter of about 2 mils. The mixture is spread to form a layer having a thickness of approximately 10 mils. The free surface of the mixture may be left uncovered. A magnetic field having a strength of approximately 400 oersteds is then applied in a direction perpendicular to the layer while the adhesive is cured at approximately 100° C. Preferably the compression interconnect material such as 40 may transmit a signal at about 1.7 Gb/s (0.158 ns rise time) with 5.0% reflection or less.

Other types of elastomeric connector materials may include a pad array interconnect known as Matrix MOE connector, and FujiPolymer W-Series materials, which includes wires extending through the thickness of the elastomer. These wires are typically located on a regular grid.

It is noted that the present invention is not limited in scope to a particular kind of compression elastomeric interconnect. For example other suitable compression interconnects may be employed such as Interposer and Micro-Interposer brands manufactured by AMP. These products are micro-mechanical contacts which require 300 grams and 150 grams force per contact, respectively, to form a reliable interconnect. Other examples include EII and PAI brands manufactured by AUGAT. These products are designed for 50-mil centerline pad array interconnection. EII is constructed from a flexible circuit and utilizes through-hole technology, while PAI is made from miniature compression mountable spring plungers.

However, it is desired that the compression interconnect meet the electrical design specifications relating to the particular applications employed in connection with the present invention. For example, not all elastomeric compression interconnect materials are suitable for RF applications. Preferably, the magnetically aligned materials employed in the present invention and described previously, have shown to be advantageously useable at frequencies up to about 4 GHz—which is an approximate frequency limit for testing purposes.

A flex circuit 36 is positioned over compression interconnect 40, such that holes 38 of the flex circuit overlay holes 42, 48 and 52. Signal lines 30 are embedded within flex circuit 36 and are configured to carry radio frequency signals. The length of flex circuit 36 depends on requirements of the particular radio frequency RF distribution fabric to be implemented. Preferably, when the RF distribution fabric is implemented in a wireless base station of a wireless telecommunications system, the length of the flex circuit may be about 20 inches long.

Signal lines 30 are preferably made of copper, and are embedded in a flexible dielectric material 26. The loss of radio frequency signals carried in signal lines 30 depends on, among other things, the dielectric constant and the dielectric dissipation factor. In accordance with one aspect of the invention flex circuit 36 may advantageously include interstitial ground lines 28 positioned adjacent to signal lines 30, although the invention is not limited in scope in that respect. Advantageously, the use of ground lines 28 may substantially reduce cross talk between signal lines 30. Signal lines 30 and ground lines 28 are preferably situated between two ground planes disposed on the outer surface of dielectric 26. As it will be explained in more detail in reference with FIGS. 2a and 2b, contact pads for coupling conductors 47 and signal lines 30 are preferably situated on the one surface of flex circuit 36 positioned against compression interconnect 50. Finally, a cover 20 is positioned over flex circuit 36, such that holes 22 overlay holes 38. Cover 20 is advantageously made of an insulating material. A screw 120 (FIG. 4) may run through holes 22, 38, 42, 48 and 52, to attach the circuit board signal lines and the flex circuit signal lines via compression interconnect 40. It is noted that other suitable means of attachment, such as clamping or bonding may also be employed.

Figure 2B:
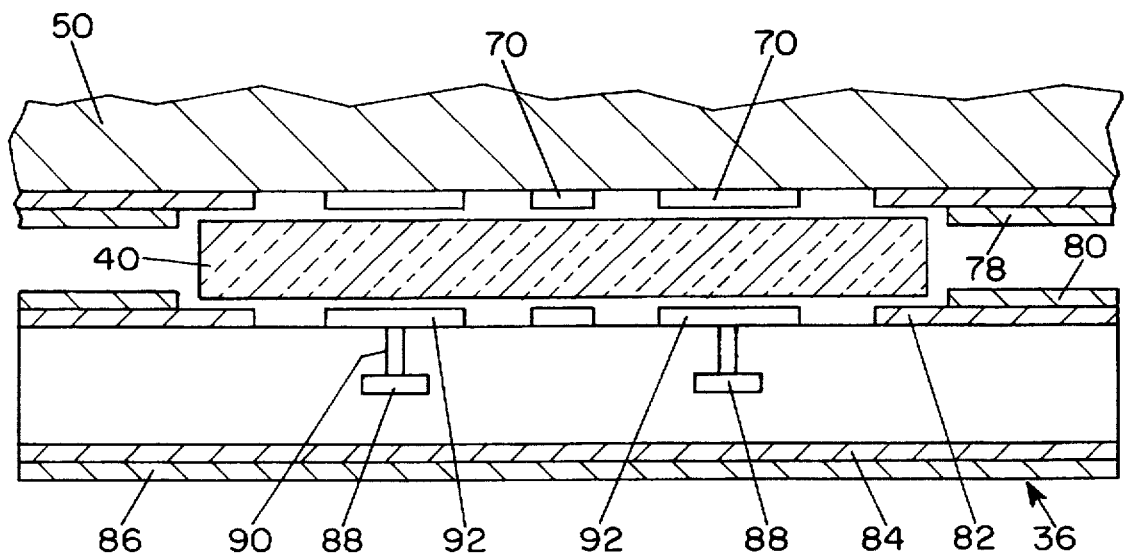

FIGS. 2a and 2b illustrate the side views of one embodiment of an interconnection system 10 in accordance with the present invention, although the invention is not limited in scope to this embodiment. As illustrated in FIG. 2a a flex circuit 36 is coupled to circuit board 50 via compression interconnect 40. Flex circuit 36 comprises a ground plane 84 disposed over the internal section of a solder mask layer 86. A dielectric layer 26 is disposed over ground layer 84. Dielectric layer 26 comprises a flexible substrate and is formed from multiple layers. An exemplary signal line 88 is preferably embedded within the dielectric layer. In this particular context, signal line 88 is positioned along an axis perpendicular to the plane of the paper. A ground layer 82 is disposed over dielectric layer 26. Ground layer 82 is configured so as to form openings 94. A contact pad 92 is disposed over dielectric 26, and is coupled to signal line 88 via a through-hole 90. Contact pad 92 is preferably made of gold-plated copper.

A solder mask layer 80 is disposed over ground layer 82, and is configured so as to form openings 96. Compression interconnect 40 is positioned over flex circuit 36 so as to make contacts with contact pad 92 and ground plane 82 through openings 96. Compression interconnect 40 is positioned to also make contact with circuit board 50 as described below.

Circuit board 50 may be a circuit pack employed in a wireless base station of a wireless telecommunications system, although the invention is not limited in scope in that respect. Thus, circuit board 50 may be a printed circuit board having radio frequency signal traces. Such signal traces may be disposed on the circuit board. In the alternative, as illustrated in FIG. 2a, signal lines 70 may be embedded within circuit board 50. In this particular context, signal line 70 is coupled to a contact pad 74 via a through hole 72. Circuit board 50 may preferably include a ground layer 76 disposed over the external surface of circuit board 50, covered by a mask layer 78. Ground layer 76 is configured so as to form openings 98. Likewise, solder mask layer 78 is configured so as to form openings 102.

As mentioned previously, signal lines 88 within dielectric 26 have preferably a substantially low signal loss. This signal loss is preferably in the order of 0.5 dB, or less, for a 20"-long flex circuit. However, signal losses of about 2 through 4 dB may be sufficiently acceptable. Flex circuit 36 is preferably made of a dielectric material with a dielectric constant of about 2 through 4 and a dissipation factor of about 0.005 or less at 1 GHz.

To this end, dielectric 26 may be made of Kapton laminate in conjunction with Arcrylic Bondply both manufactured by DuPont. In accordance with one aspect of the invention, flex circuit 36 may be manufactured in two steps. During the first step, two dielectric layers of Kapton laminate are formed, with a thickness of approximately half of the final thickness of flex circuit 36. On one of the dielectric layers signal lines 88 are formed. Thereafter during the second step, the other half of dielectric layer is bonded to the first half using the Arcrylic Bondply. Table 1 illustrates dielectric properties of Kapton and Acrylic Bondply in accordance with one aspect of the invention, although the invention is not limited in scope in this respect.

TABLE 1

|  | Dielectric Constant @ 1 MHz | Dissipation Factor @ 1 MHz |
| --- | --- | --- |
| Kapton (polyimide) | 3.6 | 0.02 |
| Acrylic Bondply | 3.6 | 0.02 |

In accordance with another aspect of the invention, flex circuit 36 may be made of Gore-Flex laminate and Speedboard J Bondply, both manufactured by GoreTex. Table 2 illustrates dielectric properties of these materials.

TABLE 2

|  | Dielectric Constant @ 1 MHz | Dissipation Factor @ 1 MHz |
| --- | --- | --- |
| Gore-Flex laminate | 3.1 | 0.005 |
| Speedboard J Bondply | 2.3 | 0.004 |

In accordance with another aspect of the invention, it is desirable to make flex circuit 36 of one dielectric material instead of two. This results in substantially better signal characteristics. One approach to manufacture a flex circuit with one dielectric, in accordance with one aspect of the invention, is to fabricate flex circuits using thermoplastic materials. Thin plys of thermoplastic substrate covered by a copper layer is preferably employed, onto which copper signal lines are then patterned, prior to a bonding or laminating process. The thermoplastic plys may then be advantageously laminated to produce a structure in which the signal conductors are embedded within a homogenous dielectric. An example of such thermoplastic material is Vectra brand dielectric manufactured by Hoechst-Celanese. Table 3 illustrates the electrical characteristics of Vectran, which is a liquid crystal polymer (LCP) product.

TABLE 3

|  | Dielectric Constant @ 1 GHz | Dissipation Factor @ 1 GHz |
| --- | --- | --- |
| Vectran (liquid Crystal Polyemer) | 2.9 | 0.0025 |

Finally, other thermoplastic materials that may be suitable for use as flex circuit 36 are illustrated in Table 4 below.

TABLE 4

|  | Dielectric Constant @ 1 GHz | Dissipation Factor @ 1 GHz |
| --- | --- | --- |
| TPX (polymethyl pentene) | 2.2 | 0.00007 |
| Noryl (polyphenylene oxide) | 2.8 | 0.0009 |
| Propylux (polypropylene) | 2.3 | 0.002 |
| Lennite (polyethylene) | 2.5 | 0.0006 |

FIG. 2b illustrates another embodiment of interconnection system 10 showing a plurality of signal lines 88 in flex circuit 36 coupled to signal lines 70 in circuit board 50. It is noted that although exemplary illustrations of flex circuit 36 include one layer of signal lines, it may be desirable to have multiple layers of signal lines for some applications. Furthermore, circuit board 50 may also be made of multiple layers of signal traces.

FIGS. 3a and 3b illustrate an embodiment of circuit board such as 50 in more detail. FIG. 3a is a perspective view of circuit board 50 as described in reference with FIG. 1. FIG. 3b is a side view illustration of circuit board 50 having a plurality of signal lines 70 embedded within the circuit board and coupled to contact pads 56 via through holes 72.

Figure 4:
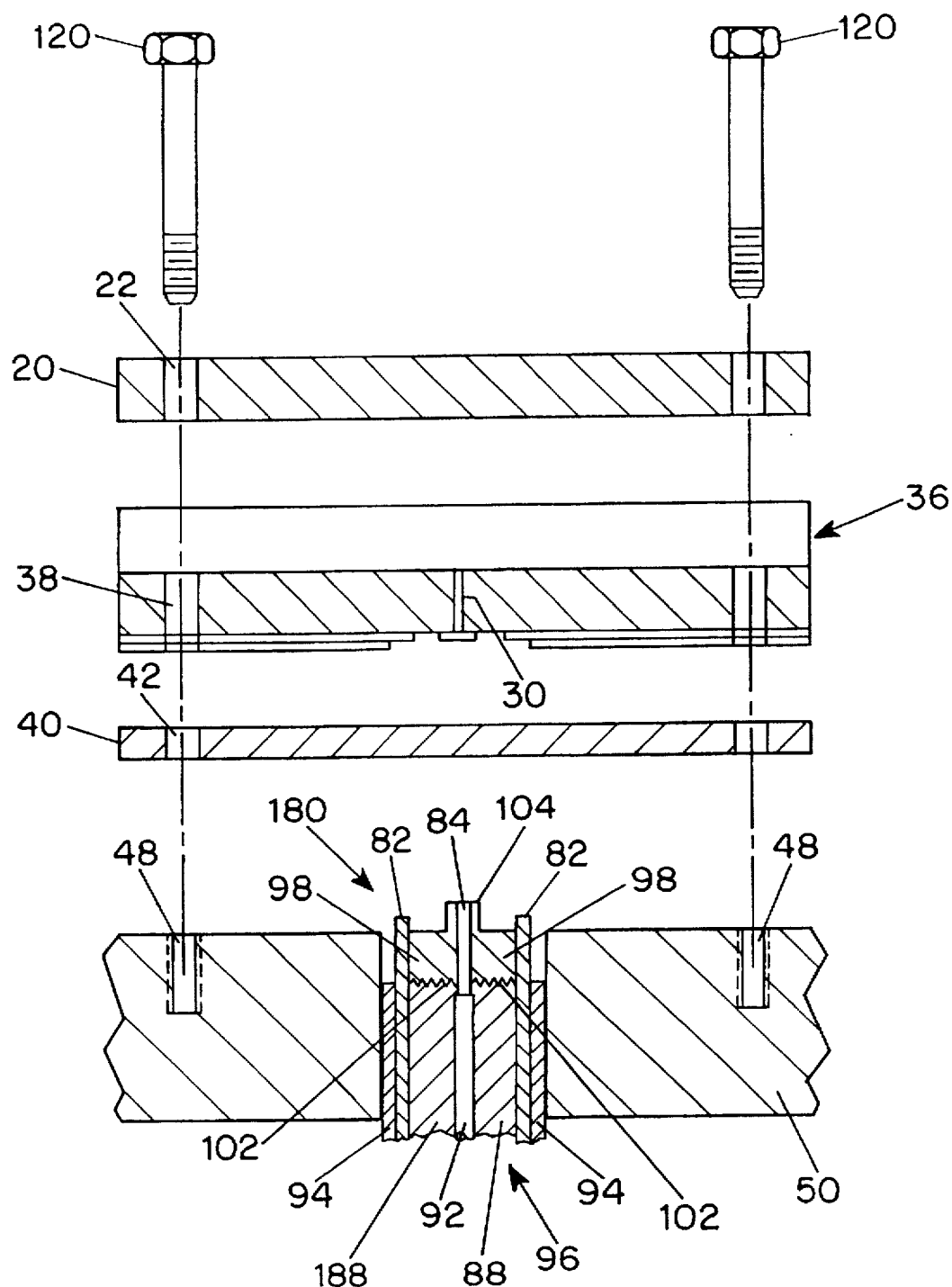
FIG. 4 illustrates a retrofit application of an interconnection system in accordance with the present invention.

As mentioned before, many existing circuit boards employed in radio frequency related applications incorporate coaxial pin connectors that cannot directly be used in conjunction with an elastomeric compression interconnect so as to couple radio frequency signal lines to a flex circuit. In accordance with one embodiment of the invention, it is desirable to retrofit such coaxial connectors so that an interconnection system described herein may be implemented. FIG. 4 illustrates one such retrofit application, although the invention is not limited in scope in that respect.

FIG. 4 illustrates a circuit board such as 50 having an existing coaxial pin connector 96, which includes a signal pin 92 and annular grounding receptacle 94. In one embodiment of the invention, coaxial pin connector is advantageously modified such that insulating sections 188 are pressed downwardly to below lines 102. An adaptor plug 180 is then inserted over coaxial pins 92 and within the annular grounding receptacle 94 of the coaxial connector. Plug 180 includes a signal connector 84 topped by a contact pad 104. Signal connector 84 couples detachably to pin 92. Adaptor plug 180 includes an annular ground ring 82 that couples to ground pins of coaxial connector 96. The annular ground ring 82 along with contact pad 104 may then be coupled to compression interconnect 40 to form an interconnection system with flex circuit 36 as described above.

Thus, the present invention allows substantial cost savings for implementing radio frequency distribution fabrics over prior art interconnection systems. Furthermore, the present invention allows the possibility of substantially miniaturizing such radio frequency distribution fabrics.

The foregoing merely illustrates the principles of the inventions. It will thus be appreciated that those skilled in the art will be able to devise various arrangements which, although not explicitly described or shown herein, embody the principles of the invention and are thus within its spirit and scope.

We claim:

1. An interconnection system comprising:
   a circuit board having signal conductors for carrying electrical signals said signal conductors being embedded within said circuit board;
   at least one contact pad coupled to one of said signal conductors via a conduction element defining a through-hole;

a ground layer disposed over portions of said circuit board such that an opening is formed between said ground layer and said contact pad;

a compression interconnect having a first and a second outer surface, said first outer surface of said interconnect releasably disposed next to said contact pad of said circuit board;

a radio frequency flex circuit having at least one contact pad coupled to a signal conductor, said contact pad releasably disposed next to said second outer surface of said elastomeric compression interconnect; and a plurality of interstitial ground lines positioned adjacent said signal conductor of said flex circuit.

2. An interconnection system in accordance with claim 1, wherein said radio frequency flex circuit further comprises a dielectric material and a bonding material each having a dielectric constant in a range of about 2 to about 4 and a dissipation factor less than about 0.005 at 1 GHz.

3. An interconnection system in accordance with claim 2, wherein said dielectric material is a polyimide laminate and said bonding material is an acrylic bonding material.

4. An interconnection system in accordance with claim 3, wherein the dielectric constants of said polyimide laminate and said acrylic bonding material at about 1 MHZ is about 3.6, and the dissipation factors of said polyimide laminate and said acrylic bonding material at 1 MHZ is 0.02.

5. An interconnection system in accordance with claim 2, wherein said dielectric material is a Gore-Flex laminate and said bonding material is a Speedboard J Bondply bonding material.

6. An interconnection system in accordance with claim 5, wherein said laminate and said bonding material have a dielectric constant of less than about 3.1 at about 1 GHz and a dissipation factor of less than about 0.005 at about 1 GHz.

7. An interconnection system in accordance with claim 1, wherein said radio frequency flex circuit comprises a thermoplastic substrate having a plurality of signal lines laminated within said substrate.

8. An interconnection system in accordance with claim 7, wherein said thermoplastic substrate has a dielectric constant of about 2.9 and a dissipation factor of about 0.0025 at 1 GHz.

9. An interconnection system in accordance with claim 2, wherein said radio frequency flex circuit comprises a first and second section made of said dielectric material, said first section adapted to contain a plurality of signal lines, said first and second section bonded together by said bonding material.

10. An interconnection system in accordance with claim 9, wherein said signal lines are made of copper.

11. An interconnection system in accordance with claim 10, wherein a ground line is disposed adjacent to said signal line.

12. An interconnection system in accordance with claim 1, wherein said compression interconnect comprises an elastomeric composite material.

13. An interconnection system in accordance with claim 12, wherein said elastomeric interconnect further comprises a composite material having substantially spherical particles exhibiting substantially magnetic properties, disposed in a nonconductive matrix material adapted to define said first and second outer surface, wherein said magnetic particles are further adapted to align into mutually isolated chains.

14. An interconnection system in accordance with claim 13, wherein said isolated chains protrude from said matrix material at said at least one outer surface.

15. An interconnection system in accordance with claim 13, wherein said elastomeric compression interconnect is securely attached to said circuit board by a securing means.

16. An interconnection system in accordance with claim 13, wherein said elastomeric compression interconnect is securely bolted to said circuit board by screws.

17. An interconnection system comprising:

a circuit board having signal conductors for carrying electrical signals, said signal conductors being embedded within said circuit board;

a plurality of contact pads, each coupled to one of said conductors via a conduction element defining a through-hole;

a ground layer disposed over portions of said circuit board such that an opening is formed between said ground layer and said contact pad;

an elastomeric compression interconnect having a first and a second outer surface, said first outer surface of said interconnect releasably disposed next to said contact pads of said circuit board;

a radio frequency flex circuit having a plurality of contact pads each coupled to a signal conductor via a through-hole, said contact pads releasably disposed next to said second outer surface of said elastomeric compression interconnect, said flex circuit further comprises a dielectric material and a bonding material each having a dielectric constant in a range of about 2 to about 4 and a dissipation factor of less than about 0.005 at 1 GHZ; and a plurality of interstitial ground lines positioned adjacent said signal conductor of said flex circuit.

18. An interconnection system in accordance with claim 17, wherein said elastomeric compression interconnect further comprises a composite material having magnetic electrically conductive substantially spherical particles disposed in a nonconductive matrix material adapted to define said first and second outer surface, wherein said magnetic particles are further adapted to align into mutually isolated chains.

19. An interconnection system in accordance with claim 18; wherein said circuit board, said interconnect material and said flex circuit are attached together so as to form electrically conductive paths between signal lines in said circuit board and corresponding signal lines in said flex circuit.

20. An interconnection system comprising:

a circuit board having signal conductors for carrying electrical signals;

annular grounding receptacle separated from each of said signal conductors of said circuit board by an insulating section;

an adaptor plug disposed over said signal conductor of said circuit board and against said grounding receptacle, said adaptor plug comprising a signal connector coupled to a contact pad, said signal connector adapted to couple detachably to said signal conductor of said circuit board, said adaptor plug further comprising an annular ground ring coupled to said annular grounding receptacle;

a compression interconnect having a first and a second outer surface, said first outer surface of said interconnect releasably disposed next to said contact pad of said circuit board; and a radio frequency flex circuit having at least one contact pad coupled to a signal conductor, said contact pad releasably disposed next to said second outer surface of said elastomeric compression interconnect.

21. An interconnection system in accordance with claim 20, wherein said flex circuit is configured to include a plurality of contact pads each coupled to a signal conductor within said flex circuit via a through-hole, said contact pads releasably disposed next to said second outer surface of said elastomeric compression interconnect, said flex circuit further comprises a dielectric material and a bonding material each having a dielectric constant in a range of about 2 to about 4 and a dissipation factor less than about 0.005 at 1 GHz.

* * * * *